United States Patent [19]
Itoh et al.

[11] Patent Number: 5,691,837
[45] Date of Patent: Nov. 25, 1997

[54] MAGNETO-OPTICAL ELEMENT AND OPTICAL MAGNETIC FIELD SENSOR USING THE SAME

[75] Inventors: Nobuki Itoh, Osaka; Hisashi Minemoto, Ootsu; Daisuke Ishiko; Satoshi Ishizuka, both of Osaka, all of Japan

[73] Assignee: Matsushita Electric Industrial Co., Ltd., Osaka, Japan

[21] Appl. No.: 615,940

[22] Filed: Mar. 14, 1996

[30] Foreign Application Priority Data

Mar. 17, 1995 [JP] Japan ..................... 7-058935

[51] Int. Cl.$^6$ ............................................ G06F 1/00
[52] U.S. Cl. ................... 359/324; 359/280; 359/281; 250/277.14; 250/231.1; 324/244.1; 252/62.57
[58] Field of Search ........................ 359/324, 280, 359/281; 250/227.14, 231.1, 225; 324/244.1; 252/62.57, 62.58

[56] References Cited

U.S. PATENT DOCUMENTS

| | | | |
|---|---|---|---|
| 4,581,579 | 4/1986 | Nagatsuma et al. | 324/244.1 |
| 5,212,446 | 5/1993 | Itoh et al. | 324/244.1 |
| 5,512,193 | 4/1996 | Shirai et al. | 252/62.57 |
| 5,566,017 | 10/1996 | Suzuki et al. | 359/281 |

FOREIGN PATENT DOCUMENTS

| | | |
|---|---|---|
| 0086387 | 8/1983 | European Pat. Off. . |
| 0510521 | 10/1992 | European Pat. Off. . |
| 5119288 | 5/1993 | Japan ..................... 358/324 |

OTHER PUBLICATIONS

"Fiber-Optic Monitoring Sensor System for Power Distribution Lines," by Ishiko et al., National Technical Report, vol. 38, No. 2, p. 127, Apr. 1992, with English abstract.

"Bi-Substituted Rare-Earth Iron Garnets for Fiber Optic Current Sensors" by Ihto et al., The Technical Report of the Institute of Electronics, Information and Engineers, QQE92-105, pp. 43–48, 1992, with English abstract.

"Magneto-Optical Hysteresis Loops of Multidomain Materials—Calculation for Fixed Analyszer Method" by T. Numata et al.; Journal of the Magnetic Society of Japan, vol. 14, No.4: 1990; pp., 642–647, with English abstract.

"Optical Magnetic Field Sensor Implemented by Converging Optical System" by Itoh et al., The Institute of Electrical of Japan, Information No. IM–94–93, pp. 31–40, 1994, with English abstract.

"Optical Magnetic Field Sensors with High Linearity Using Bi-Substituted Rare Earth Iron Garnets" by N. Itoh et al., IEEE Transactions of Magnetics: vol. 31, No. 6, Nov. 1995. Journal of Applied Physics, vol. 75, No. 10, 15 May 1994, New York US, pp. 6801–6803, XP002003820.

O. Kamada et al: "Magneto-optical properities of (BiGdY)$_3$Fe$_5$O$_{12}$ for optical magnetic field sensors".

*Primary Examiner*—Loha Ben
*Attorney, Agent, or Firm*—Lowe, Price, LeBlanc & Becker

[57] ABSTRACT

A magneto-optical element comprises a film of a Bi-substituted rare earth iron garnet selected from garnets of the following chemical formulas $$(Bi_xGd_yR_zY_{3-x-y-z})(Fe_{5-w}Ga_w)O_{12}$$

wherein R represents at least one element selected from the group consisting of rare earth elements other than Gd, and x, y, z and w are such that $1.00 \leq x \leq 1.30$, $0.42 \leq y \leq 0.60$, $0.01 \leq z \leq 0.05$ and $0.40 \leq w \leq 0.62$, and $$(Bi_{x'}Gd_{y'}R_{z'}Y_{3-x'-y'-z'})Fe_5O_{12}$$

wherein R is as defined above, and x', y' and z' are such that $1.10 \leq x' \leq 1.30$, $1.00 \leq y' \leq 1.80$, $0 \leq z' \leq 0.06$. An optical magnetic field sensor capable of detecting zeroth to higher order beams of diffracted light is also described.

13 Claims, 6 Drawing Sheets

MAGNETO-OPTICAL ELEMENT AND OPTICAL MAGNETIC FIELD SENSOR USING THE SAME

BACKGROUND OF THE INVENTION

1. Field of the Invention

This invention relates to a magneto-optical element which makes use of the Faraday effect and also to an optical magnetic field sensor using the element.

2. Description of the Prior Art

For the measurement of a magnetic field intensity generated about a current being passed by use of light, optical magnetic field sensors are known which include, in combination, a magneto-optical element having the Faraday effect and optical fibers. Because of the advantages in that they are highly insulative and suffer little influence of electromagnetic induction noises, this type of magneto-optical sensor has been in use as a sensor of detecting defectives in high voltage distribution lines in the field of electric power. In recent years, there is a great demand for the sensor which has higher performance for use as a magnetic field measuring instrument. In fact, magneto-optical sensors having a higher accuracy and a smaller size are in keen demand by the field.

For the arrangement of optical magnetic field sensors utilizing the Faraday effect, usual practice is to employ a sensor head constituted of a collimated beam optical system as is particularly shown in FIG. 1 (National Technical Report Vol. 38, No. 2, p. 127 (1992)). In the figure, there is generally shown a sensor S. The sensor S includes an optical element unit M. The unit M has a magneto-optical element 1 provided between a polarizer 2 and an analyzer 3, and a total reflection mirror 4 connected to the analyzer 3. The polarizer 2 is optically connected to a beam inlet side collimating lens unit 7a with an input optical fiber 6a as shown. The total reflection mirror 4 is optically connected to a collimating lens unit 7b with an output optical fiber 6b extending from the lens unit 7b as shown. The collimating lens units 7a, 7b are, respectively, made, for example, of a distributed refractive index lens with pitches of 0.25.

In this arrangement, the magneto-optical element is placed in a magnetic field, H. A light beam transmitted from the optical fiber 6a is converted to parallel beams by means of the collimating lens unit 7a and polarized linearly by means of the polarizer 2, followed by transmission to the magneto-optical element 1. The polarization plane is rotated in proportion to the magnetic field intensity applied to the element 1 by the Faraday effect. The thus rotated, linearly polarized light is then passed to the analyzer 3 whose direction of the polarized light to be passed differs from that of the polarizer by 45°. The thus passed light is reflected with the total reflection mirror 4, followed by convergence through the collimating lens unit 7b and focusing on the output optical fiber 6b.

This type of sensor optical system is based on a so-called non-differential fixed analyzer method wherein the analyzer is fixed therein and the light transmitted from the analyzer is utilized only as one port. In this optical magnetic field sensor, the variation in the magnetic field intensity is converted to a variation in quantity of light, enabling one to measure the variation in the magnetic field intensity.

The magneto-optical element used in the sensor head which is constituted of such a collimated beam optical system as set out above is made, for example, of a rare earth iron garnet of the following chemical formula in the form of crystals as set out, for example, in The Technical Report of the Institute of electronics, Information and Communication Engineers, OQE92-105 (1992).

In this prior art, the magneto-optical element which has a good temperature characteristic is realized by partial substitution of Y with Bi and Gd.

However, where a magneto-optical element to be applied to an optical magnetic field sensor is made of rare earth iron garnet crystals, the light transmitted through the crystals is diffracted owing to the magnetic domain structure inherent to the garnet crystals. If the garnet crystals have the maze magnetic domain structure, the diffracted beams are observed on concentric circles as shown in FIG. 2. In the figure, input light indicated by a thick solid arrow is passed through the garnet element 1 and observed on a screen 8 as concentric circles 9, 10, 11 and 12 in the Fraunhofer region. More particularly, the observed light rays 9, 10, 11 and 12 are, respectively, defined as a zeroth-order beam, a first-order beam, a second-order beam and a third-order beam. With the sensor head constituted of the collimated beam optical system as shown in FIG. 1, the zeroth-order beam alone is observed at the output side optical fiber 6b as the diffracted light. Accordingly, the output, $V_0$, is shown according to the following equation (1)

$$V_0 = (\frac{1}{2})[\cos\theta_F + (M/M_s)\sin\theta_F]^2 \quad (1)$$

wherein $\theta_F$ is an angle of Faraday rotation in a magnetically saturated condition and is expressed as $\theta_F = F \cdot L$ in which F represents a coefficient of Faraday rotation inherent to the material used and L is a length of light path of the element, M is a magnetization of the material, and $M_s$ is a saturation magnetization.

This entails the following problem that as an applied magnetic field intensity increases, the non-linearity of the sensor output becomes great, with the linearity being degraded (Journal of The Magnetic Society of Japan, Vol. 14, No. 4, p. 642 (1990)).

On the other hand, the output, $V_{all}$, of an optical magnetic field sensor composed of an optical system wherein all the order beams of diffracted light are detected is represented by the equation (2)

$$V_{all} = (\frac{1}{2})[1 + (M/M_s)\sin 2\theta_F] \quad (2)$$

wherein M, $M_s$ and $\theta_F$ are, respectively, as defined in the equation (1). In this equation, any term of non-linearity is not contained, so that the output is simply proportional to an applied magnetic field. However, any optical magnetic field sensor which is small in size and high in accuracy has never been realized in the art as being capable of detecting all order diffracted beams.

In order to solve the problem on the non-linearity of the sensor output, an attempt has been made wherein a converged beam optical system is constituted using spherical lenses 5a, 5b as shown in FIG. 3, with which diffracted beams including up to the second-order are detected, thereby improving the linearity (The Technical Report of Keisoku-kenkyuukai, The Institute of Electrical Engineers of Japan, Information No. IM-94-93, p. 31 (1994)). The optical magnetic field sensor of FIG. 3 differs from the optical magnetic field sensor of FIG. 1 using the collimated beam optical system in that the use of the spherical lenses 5a, 5b results in the formation of a converged beam optical system within the head. A plurality of loci in FIG. 3 indicate the results of calculation of beam tracings. The use of the converged beam optical system as the sensor head enables one to detect up to second-order beams among the diffracted beams in the magneto-optical element. It should be noted that like reference numerals in FIG. 3 indicate like members or parts of FIG. 1. In this prior art technique, a good linearity error of not greater than 1.0% is established within a range of magnetic field of from about 25 Oe to 300 Oe as shown in FIG. 4. However, the linearity error becomes too high for measurement of a weak magnetic field intensity of not greater than 25 Oe, thus presenting a problem in practical applications.

Where the magneto-optical element which is applied to the collimated beam optical system using the garnet crystals as defined hereinbefore is employed in the optical magnetic field sensor of the type shown in FIG. 3, good linearity is obtained. However, this type of sensor has the problem that the temperature characteristic greatly changes as is particularly shown in FIG. 5. From this, it will be seen that the sensitivity varies from −4.5 to +6.3% within a temperature range of −20° C. to +80° C.

SUMMARY OF THE INVENTION

It is accordingly an object of the invention to provide a magneto-optical element which is able to improve a linearity error for magnetic field intensity over a wide range of magnetic field and exhibits good a temperature characteristic in the vicinity of room temperature with good sensitivity.

It is another object of the invention to provide an optical magnetic field sensor which ensures high measuring accuracy.

It is a further object of the invention to provide an optical magnetic field sensor which is capable of detecting zeroth-order to higher order beams of the light diffracted by means of a magneto-optical element.

According to one embodiment of the invention, there is provided a magneto-optical element made of a member selected from the group consisting of Bi-substituted rare earth iron garnets of the following chemical formulas (3) and (4)

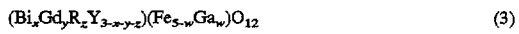

$$(Bi_xGd_yR_zY_{3-x-y-z})(Fe_{5-w}Ga_w)O_{12} \qquad (3)$$

wherein R represents at least one element selected from the group consisting of rare earth elements other than Gd, and x, y, z and w are such that $1.00 \leq x \leq 1.30$, $0.42 \leq y \leq 0.60$, $0.01 \leq z \leq 0.05$ and $0.40 \leq w \leq 0.62$, and

$$(Bi_{x'}Gd_{y'}R_{z'}Y_{3-x'-y'-z'})Fe_5O_{12} \qquad (4)$$

wherein R is as defined above, and x', y' and z' are such that $1.10 \leq x' \leq 1.30$, $1.00 \leq y' \leq 1.80$, $0 \leq z' \leq 0.06$ provided that $x'+y' \leq 8.0$.

The magneto-optical element according to the invention is particularly adapted for use in an optical system capable of detecting zeroth-order to higher-order diffracted beams and is appropriately replaced by existing magneto-optical elements which have been heretofore employed in existing collimated beam optical systems. When an optical system capable of detecting up to higher-order diffracted beams is adopted in a sensor head in order to improve the linearity error in output of optical magnetic field sensors, existing magneto-optical elements which are designed to detect a zeroth-order beam alone are disadvantageous in that the temperature characteristic can not be appropriately controlled, e.g. the sensitivity becomes higher at a higher temperature. As is known in the art, the temperature characteristic of an optical magnetic field sensor depends directly on the temperature characteristic of the magneto-optical element. Using the magneto-optical element, the resultant optical magnetic field sensor is able to generate a stable output against a temperature change in the vicinity of room temperature.

According to another embodiment of the invention, there is also provided an optical magnetic field sensor which is arranged to detect zeroth-order to higher order beams diffracted with a magneto-optical element.

The sensor comprises:

a magneto-optical transducer including a polarizer, a magneto-optical element, and an analyzer sequentially arranged in this order along a direction of a light beam being passed, the analyzer being provided so as to make the direction of a transmitted light beam through the magneto-optical element different from that of the polarizer so that a magnetic field to be measured is detected as an output light intensity;

a first lens optically connected via the polarizer to an end of the magneto-optical element;

a first optical fiber for inputting a light beam to the first lens;

a second lens optically connected via the analyzer to the other end of the magneto-optical element; and a second optical fiber for outputting a light beam from the second lens wherein the first optical fiber/the magneto-optical element and the magneto-optical element/the second optical fiber are arranged to constitute a confocal optical system through the first and second lenses, and the first and second optical fibers are arranged substantially in axial symmetry with respect to the magneto-optical element.

It will be noted that the term "substantially" is intended to mean that the first optical fiber/the magneto-optical element and the magneto-optical element/the second optical fiber may not be exactly in an axial arrangement, e.g. the position of the element may be axially shifted in a slight degree of ±1%.

Since the sensor of the invention has such an arrangement that the magneto-optical element and the input and output optical fibers are in a confocal optical system wherein the fibers are in axial symmetry relative to the magneto-optical element, a good linearity error of the sensor output is ensured within a wide range of magnetic field.

Preferably, the magneto-optical element used in this sensor is one defined above. Moreover, it has been found that the linearity error depends significantly on the thickness of the magneto-optical element. If the thickness of the element is not smaller than 50 µm, the linearity in a weak magnetic field can be more improved.

More particularly, the deflection angle $\alpha_{(n)}$ of an nth-order diffracted beam is represented by the equation (5)

$$\sin\alpha^{(n)} = n\lambda/p \qquad (5)$$

wherein λ is a wavelength of a light beam used, and p is a pitch of magnetic domains, i.e. a value as great as twice the width of the magnetic domain. In general, when the magneto-optical element is made of a rare earth iron garnet, the width of the magnetic domain becomes greater as the element is thicker. Accordingly, proper control in the thickness of the magneto-optical element permits the deflection angle of the diffracted beams in the magnetic domains of the element to be varied. In addition, the diffracted beams which can be detected in the output side optical fiber include those up to higher-order beams. Thus, the linearity error of the magneto-optical sensor output in a weak magnetic field can be improved.

The magneto-optical element and the tips of the input and output optical fibers are, respectively, so arranged as to be in a confocal optical relationship, and the optical fibers are located substantially in axial symmetry with respect to the element. By this, higher order beams of the diffracted light can also be detected at the end of the output optical fiber, enabling one to obtain a magnetic optical sensor which is measuring accuracy within a wider range of magnetic field.

PREFERRED EMBODIMENTS OF THE INVENTION

Figure 1:
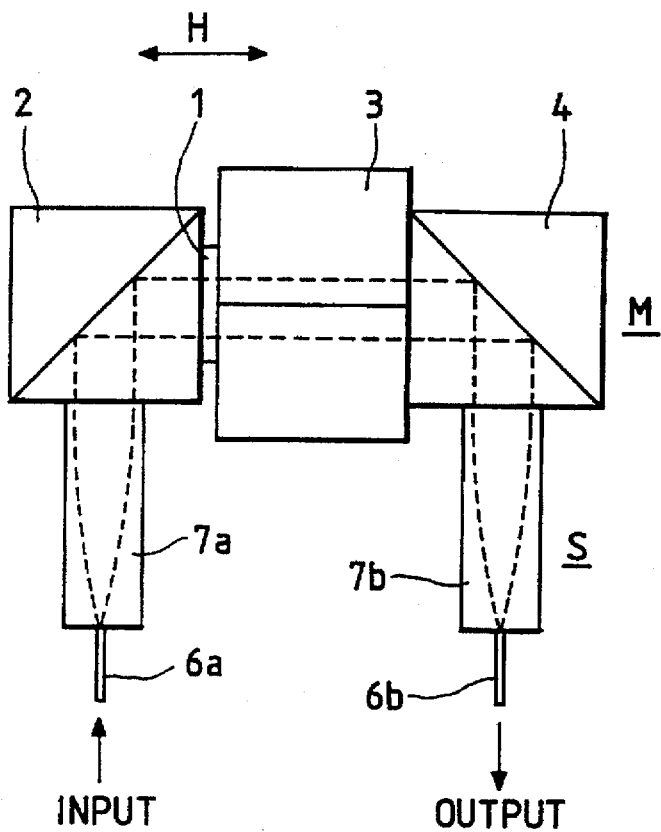
FIG. 1 is a schematic side view of a known optical magnetic field sensor.
Figure 2:
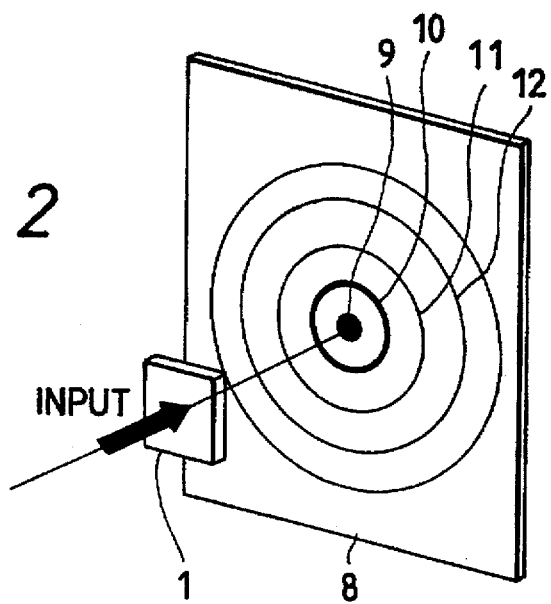
FIG. 2 is a schematic view illustrating the diffraction phenomenon of light with rare earth iron garnet crystals.

The magneto-optical element of the invention is first described.

The element is made of a rare earth iron garnet in the form of crystals. The rare earth iron garnet is of the formula (3) or (4)

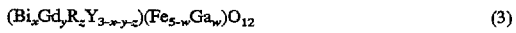

$$(Bi_xGd_yR_zY_{3-x-y-z})(Fe_{5-w}Ga_w)O_{12} \quad (3)$$

wherein R represents at least one element selected from the group consisting of rare earth elements other than Gd, and x, y, z and w are such that $1.00 \leq x \leq 1.30$, $0.42 \leq y \leq 0.60$, $0.01 \leq z \leq 0.05$ and $0.40 \leq w \leq 0.62$, or

$$(Bi_{x'}Gd_{y'}R_{z'}Y_{3-x'-y'-z'})Fe_5O_{12} \quad (4)$$

wherein R is as defined above, and x', y' and z' are such that $1.10 \leq x' \leq 1.30$, $1.00 \leq y' \leq 1.80$, $0 \leq z' \leq 0.06$ provided that $x'+y' \leq 3.0$.

The rare earth elements represented by R include those elements of the IIIB of the periodic table, preferably, La, Ce, Pr and the like. If the rare earth elements are used in combination, combinations of La with non-magnetic elements such as Yb, Lu and the like are preferred.

The rare earth iron garnet is usually employed in the form of a film having a thickness of 1 to 100 μm. Preferably, the thickness is not less than 50 μm for the reason as will be described hereinafter.

In a preferred embodiment of the invention, the rare earth iron garnet film is formed on a substrate made of a garnet single crystal by epitaxial growth. The garnet crystal substrate is preferably made of Ca-Mg-Zr-substituted $Gd_3Ga_5O_{12}$ or $Nd_3Ga_5O_{12}$. Proper selection of the rare earth elements represented by R is sufficient for lattice matching between the rare earth iron garnet and the garnet crystal substrate.

The magneto-optical element of the invention has such a garnet composition as set out above, so that it can improve the linearity error of a sensor output relative to a magnetic field intensity and ensures a good temperature characteristic along with high sensitivity.

With the garnet of the formula (4), z' may be zero and x'+y' may be 3.0. This means that the Bi-substituted site may be made of (Bi+Gd+Y) or (Bi+Gd).

The magneto-optical element having set out hereinabove is particularly suitable for application to an optical magnetic field sensor which is able to detect beams of not only a zeroth order, but also a higher order. In fact, the element of the invention may be applied to the prior art optical magnetic field sensor shown in FIG. 3. This sensor has a transducer including a polarizer 1, a magneto-optical element 2, an analyzer and a total reflection mirror 4 sequentially arranged in this order. Spherical lenses 5a, 5b are, respectively, connected at one end thereof via the polarizer 1 to an end of the element 2 and via the total reflection mirror 4 and the analyzer to the other end of the element 2, thereby forming an optical system. The spherical or ball lenses 5a, 5b are, respectively, connected at the other end thereof to optical fibers 6a, 6b. By this, beams of up to a second order of the light diffracted with the element 2 can be detected at the optical fiber 6b. When applied to this type of sensor, the magneto-optical element which is able to generate a stable output in relation to a temperature change in the vicinity of room temperature is effective in accurately detecting a variation in magnetic field intensity.

Figure 6:
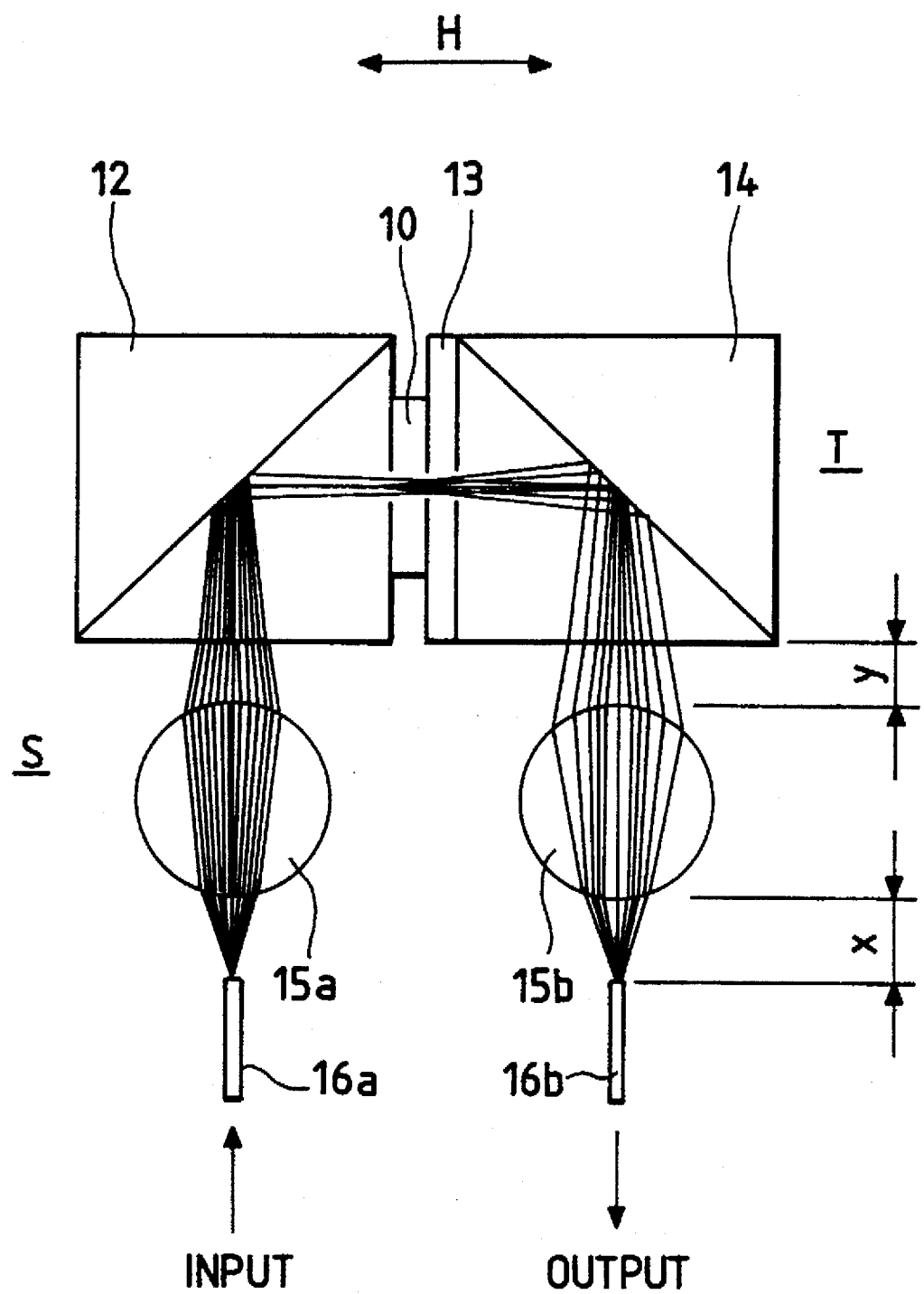
FIG. 6 is a schematic view of an optical magnetic field sensor according to one embodiment of the invention along with beam tracings in the sensor.

Reference is now made to the accompanying drawings and particularly to FIG. 6 which illustrates an optical magnetic field sensor according to an embodiment of the invention. This sensor is particularly suitable for use in combination with the element of the invention although other types of elements having magnetic domains may also be used.

FIG. 6 schematically shows an optical magnetic field sensor S which includes a transducer T. The transducer T includes a polarizer 12 made, for example, of glass, a magneto-optical element 10, an analyzer 13 made, for example, glass, and a total reflection mirror 14 sequentially arranged in this order along a direction of a light beam to be passed so that the optical axes of these elements are aligned. The analyzer is so arranged as to make the direction of a transmitted light beam through the magneto-optical element different from that of the polarizer.

A first lens 15a is connected, at one end thereof, via the polarizer 12 to one end of the magneto-optical element 10. Likewise, a second lens 15b is connected, at one end thereof, via the analyzer 14 at the other end of the magneto-optical element 10. The lens 15a, 15b are, respectively, spherical in form or may be a so-called ball lens.

The first and second lenses 15a, 15b are connected at the other end with input and output optical fibers 16a, 16b, respectively, so that a light beam from a light source (not shown) is transmitted to the first lens, and the light beam from the analyzer is detected through the spherical lens 15b to the output optical fiber 16b. Usually, each lens is accommodated such as in a casing or ferrule (not shown) to support the lens in position.

In the embodiment of FIG. 6, the input optical fiber 16a/first lens 15a and the second lens 16b/second optical fiber 15b extend from the polarizer 12 and the reflector 14a, respectively, so that they are kept away from and in parallel to each other.

In order to detect zeroth to higher order beams of diffracted light from the magneto-optical element 10 having magnetic domains, it is important that the optical magnetic field sensor be so arranged that the optical position between the input optical fiber/magneto-optical element and the magneto-optical element/output optical fiber permits a confocal arrangement through the lenses 15a, 15b and that the input and output optical fibers 16a, 16b are arranged substantially in axial symmetry with respect to the magneto-optical element 10 as shown.

Although any magneto-optical element which has a good linearity error and a good temperature characteristic may be used in the sensor of FIG. 6, it is preferred to use the magneto-optical element made of the garnet of the formula (3) or (4) with or without any substrate supporting the garnet film thereon.

A plurality of loci indicated in FIG. 6 show the results of calculation of ray tracings. As will be apparent from FIG. 6, only one optical fiber is used for input and output sides, respectively, from the standpoint of practical applications and thus, a non-differential arrangement using one port of optical output is adopted. In this connection, however, in order to improve the linearity, there may be used a sensor optical system wherein the light from a fixed analyzer in a fixed analyzer method is generated from two ports to constitute a differential arrangement.

The comparison between the ray tracings of FIG. 6 and FIG. 1 reveals that in the optical magnetic field sensor of the invention using the analyzer 13 made of a glass polarizing plate, the optical position between the input optical fiber 16a/the magneto-optical element 10 and the magneto-optical element 10/output optical fiber 16b is so arranged as to constitute a confocal optical system through the lenses 15a and 15b and that the optical fibers are arranged substantially in axial symmetry about the magneto-optical element. This is why the output optical fiber is able to detect up to higher-order beams.

In operation, a light beam from the optical fiber 16a is passed to the lens 15a and then to the polarizer 12. The thus polarized light is diffracted in the element 10 and passed to the analyzer 13 where the azimuth of the analyzer relative to the polarizer is 45° and reflected by means of the total reflector mirror 14, followed by converging through the lens 15b and passing to the output optical fiber 16b. The light intensity transmitted through the element 10 is proportional to the magnetic field intensity applied thereto. Accordingly, the magnetic field intensity can be measured as a change in the light intensity.

Figure 7:
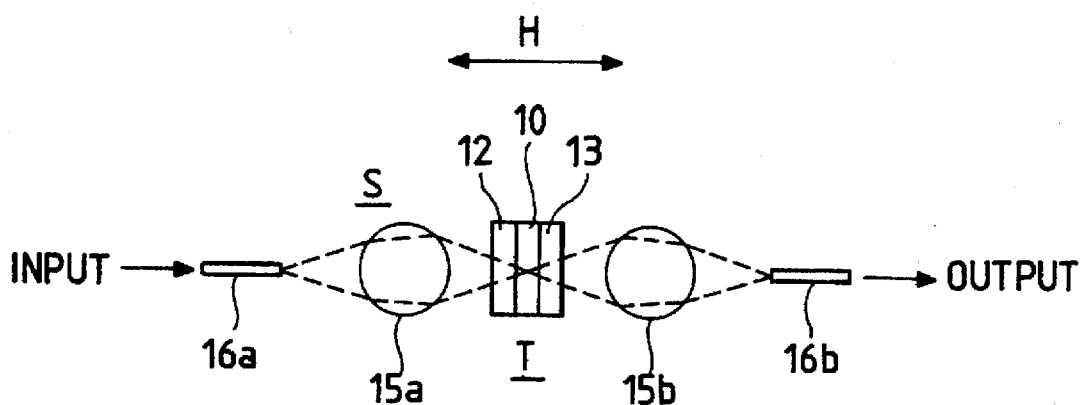
FIG. 7 is a schematic view of an optical magnetic field sensor according to another embodiment of the invention.

A linear optical magnetic field sensor according to another embodiment of the invention is shown in FIG. 7, wherein like reference numerals indicate like parts or members as in FIG. 6. In this embodiment, the transducer T is positioned in alignment with a combination of the input optical fiber 16a and the spherical lens 15a and also with a combination of the output optical fiber 6b and the spherical lens 15b at opposite sides thereof. Of course, the sensor S in this embodiment does not need any total reflection mirror as shown.

The input optical fiber 16a/the magneto-optical element 10 and the magneto-optical element 10/the output optical fiber 16b are optically in confocal arrangement through the lenses 15a and 15b, like the embodiment of FIG. 6. In addition, the optical fiber 16a/the lens 15a and the lens 15b/the optical fiber 16b are substantially in axial symmetry about the magneto-optical element 10. In order to make the linear arrangement of the sensor, the polarizer 12 and the analyzer 13 are each made of a glass polarizing plate. In this arrangement, the light diffracted from the magneto-optical element is detected up to high-order beams. The sensor of this embodiment is more advantageous over that of FIG. 6 in that smaller-sized parts may be used as will be described in examples appearing hereinafter. The light from the input optical fiber is processed in a manner similar to the embodiment of FIG. 6.

The sensors depicted in FIGS. 6 and 7 should preferably have such a magneto-optical element as set out hereinbefore.

With the sensors of FIGS. 6 and 7, the conditions of minimizing a optical sensor loss can be appropriately determined using the sizes of individual elements or parts, and the distance between the spherical lens 15a and the polarizer 12 and the distance between the input optical fiber 16a and the spherical lens 15a as will be particularly described in Examples 4 and 5.

It will be noted that when the optical magnetic field sensor is used in combination of a gapped core, an optical current measuring apparatus, such as an optical current transformer, having a high measuring accuracy can be made. Thus, the element and sensor of the invention have wide utility in industries.

The present invention is more particularly described by way of examples.

EXAMPLE 1

A $Bi_2O_3$-$PbO$-$B_2O_3$ flux was used to form a rare earth iron garnet crystal film of the general formula (3) wherein R is La, on a Ca-Mg-Zr-substituted $Gd_3Ga_5O_{12}$ substrate according to the liquid phase epitaxial method. The formulations of the respective films obtained are shown in Table 1 below wherein the constituent elements are indicated by atomic ratio.

Figure 8:
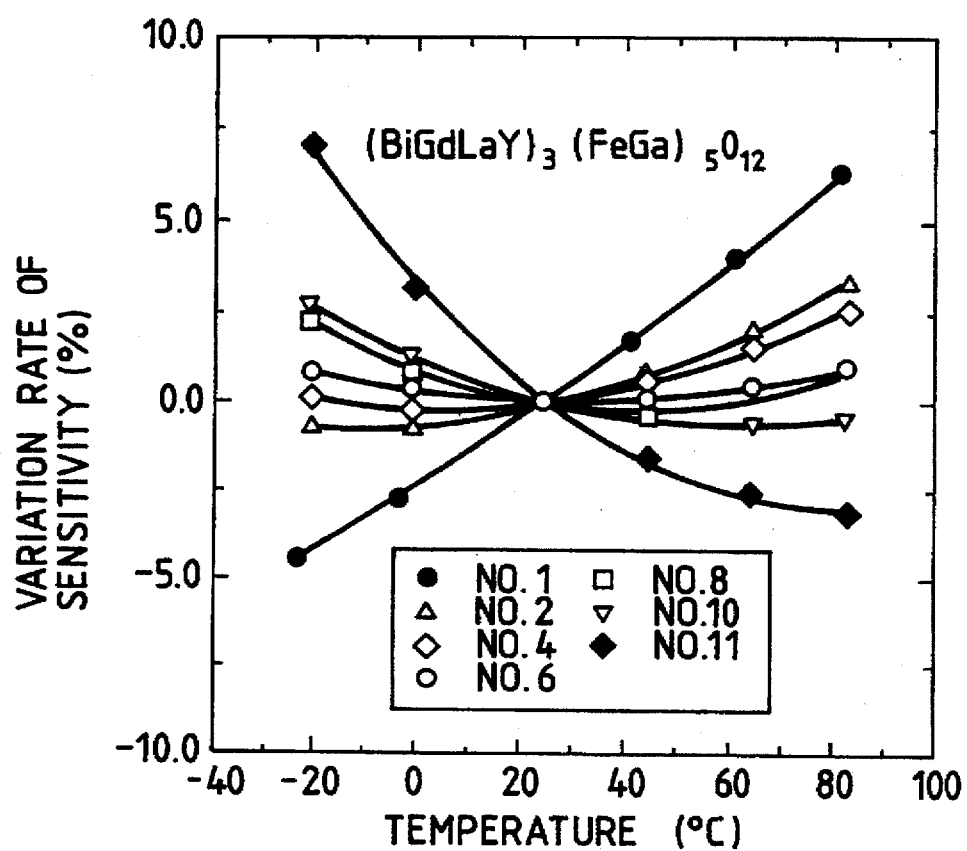
FIG. 8 is a graph showing the relation between the variation rate of sensitivity and the temperature of optical magnetic field sensors using different types of materials for magneto-optical element.

In the table, the samples marked with "#" at the column of Variation Rate of Sensor Sensitivity are outside the scope of the invention and the samples marked with "*" in Sample Number are ones whose measurements of a variation rate of sensitivity in relation to the variation in temperature are shown in FIG. 8.

Figure 3:
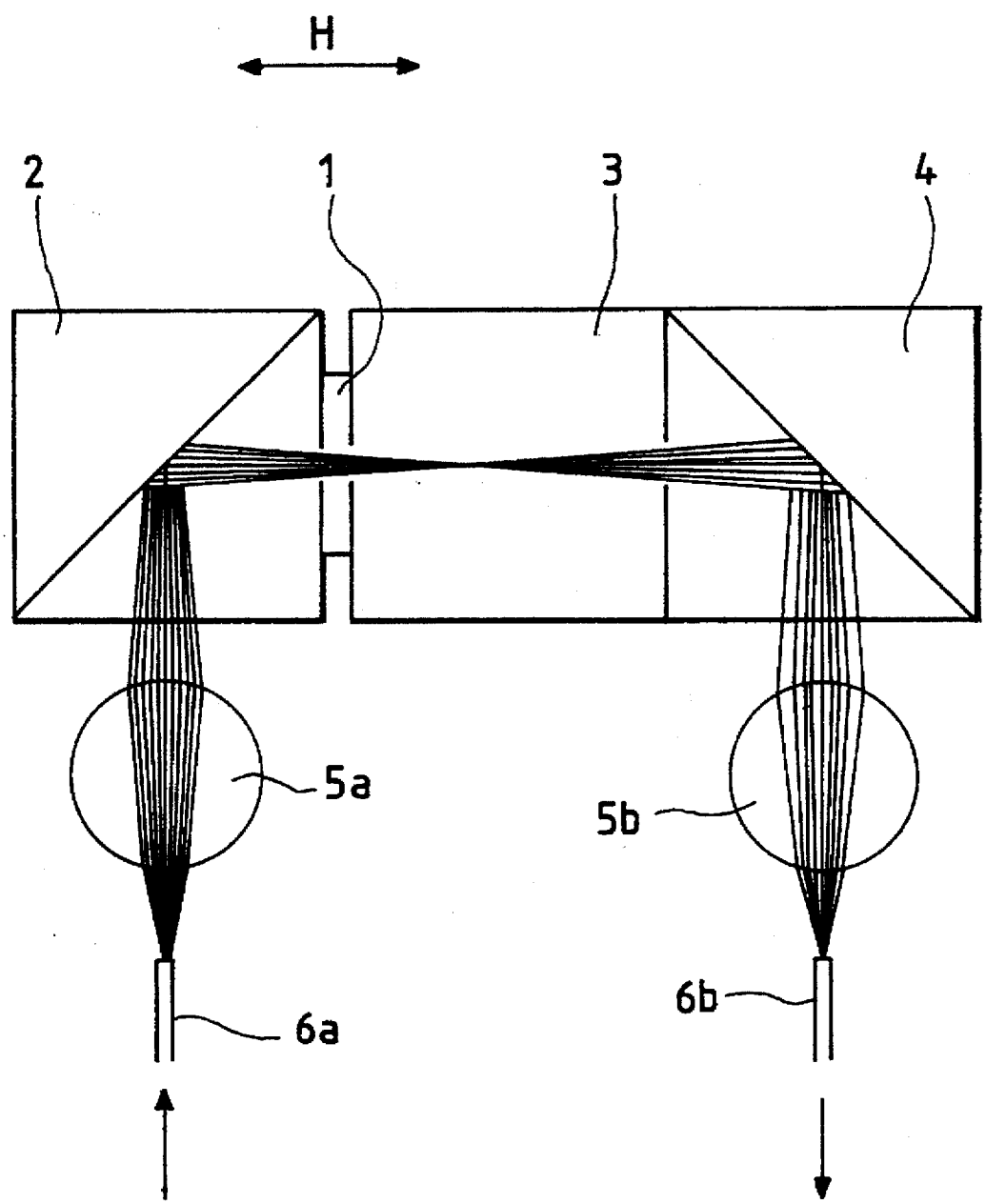
FIG. 3 is a schematic view showing an arrangement of a known optical magnetic field sensor and ray tracings in the sensor.

In order to evaluate the temperature characteristic of the respective magneto-optical elements, each element was assembled in an optical magnetic field sensor of the type shown in FIG. 3 using glass analyzer and polarizer, followed by measurement of a temperature variation of sensitivity within a magnetic field not greater than a saturation magnetic field of magneto-optical element. The frequency of an AC magnetic field was 60 Hz.

The results of the measurement are shown in Table 1 below.

TABLE 1

| Sample No. | Composition of Rare Earth Iron Garnet Crystals | | | | | | Variation Rate of Sensor Sensitivity (−20 to +80° C.) |
|---|---|---|---|---|---|---|---|
| | Bi X | Gd Y | La Z | Y 3-X-Y-Z | Fe 5-W | Ga W | |
| *1 | 1.27 | 0.12 | 0.12 | 1.49 | 4.41 | 0.59 | #10.8% |
| *2 | 1.24 | 0.40 | 0.03 | 1.33 | 4.54 | 0.46 | #4.1% |

TABLE 1-continued

| Sam-ple No. | Composition of Rare Earth Iron Garnet Crystals | | | | | | Variation Rate of Sensor Sensitivity (−20 to +80° C.) |
|---|---|---|---|---|---|---|---|
| | Bi X | Gd Y | La Z | Y 3-X-Y-Z | Fe 5-W | Ga W | |
| 3 | 1.22 | 0.42 | 0.02 | 1.34 | 4.56 | 0.44 | 3.0% |
| *4 | 1.20 | 0.46 | 0.02 | 1.32 | 4.50 | 0.50 | 2.9% |
| 5 | 1.30 | 0.47 | 0.02 | 1.21 | 4.60 | 0.40 | 2.0% |
| *6 | 1.20 | 0.51 | 0.02 | 1.27 | 4.50 | 0.50 | 1.0% |
| 7 | 1.00 | 0.55 | 0.05 | 1.40 | 4.58 | 0.42 | 1.9% |
| *8 | 1.14 | 0.57 | 0.02 | 1.27 | 4.53 | 0.47 | 2.5% |
| 9 | 1.12 | 0.60 | 0.01 | 1.27 | 4.38 | 0.62 | 3.0% |
| *10 | 1.18 | 0.61 | 0.03 | 1.18 | 4.52 | 0.48 | #3.3% |
| *11 | 1.11 | 0.85 | 0.02 | 1.02 | 4.52 | 0.48 | #3.8% |

The magneto-optical element is made of an rare earth iron garnet of the afore-indicated formula (3) wherein $1 \leq x \leq 1.30$, $0.42 \leq y \leq 0.60$, $0.01 \leq z \leq 0.05$ and $0.40 \leq w \leq 0.62$, within which the temperature variation of the sensor sensitivity is not greater than 3% (i.e. not greater than ±1.5% at a temperature ranging from −20° C. to +80° C. This is particularly shown in FIG. 8, revealing that the compositions (sample Nos. 1, 2, 10 and 11) outside the scope of the invention are inferior to those of the invention.

Figure 5:
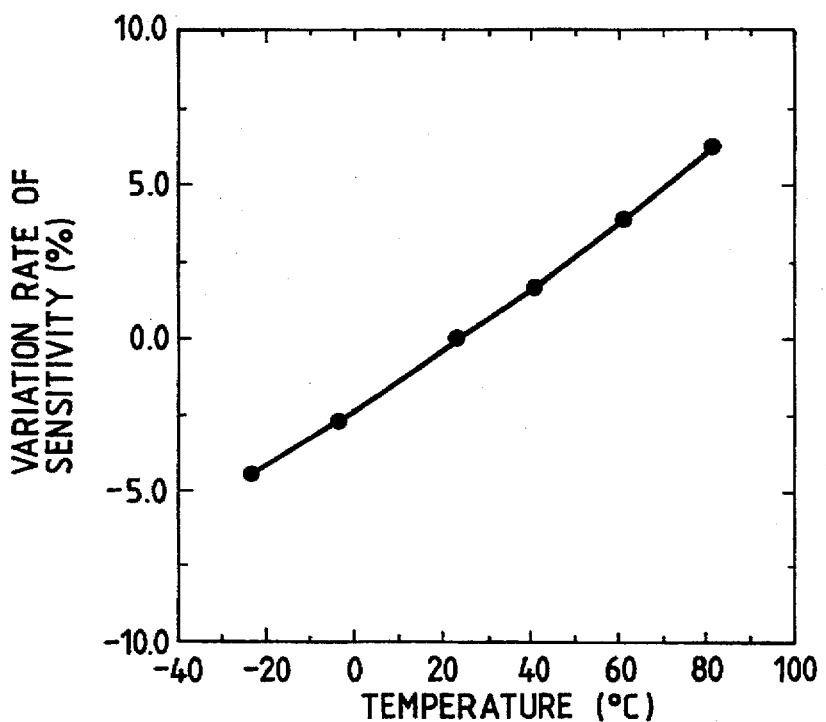
FIG. 5 is a graph showing the relation between the variation rate of sensitivity and the temperature of a known optical magnetic field sensor.

The comparison with the temperature variation, shown in FIG. 5, of the prior art element made of $Bi_{1.3}Gd_{0.1}La_{0.1}Y_{1.5}Fe_{4.4}Ga_{0.6}O_{12}$ reveals that the temperature characteristic is significantly improved.

Since the magneto-optical elements of this example were applied to the optical magnetic sensor using a converged beam optical system, the linearity of the output could be evaluated, revealing that the linearity was as good as not greater than 2.0% up to a saturation magnetic field of about 500 Oe of the rare earth iron garnet crystals.

Such good results as obtained above are considered to be based on the following fundamental theory. Optical magnetic field sensors which are constituted of optical systems capable of detecting only a zeroth beam of diffracted light have an output expressed by the afore-indicated equation (1). In the equation (1), assuming that $M=\chi H$ wherein a magnetic susceptibility, $\chi$, is constant, $H=H_{IN}\sin\omega t$ is inserted into the equation while taking the AC magnetic field into account. The DC component, $V_{ODC}$, and the AC component, $V_{OAC}$, of the sensor output are given below $$V_{ODC}=A+(\tfrac{1}{2})CH_{IN}^2 \qquad (6)$$

$$V_{OAC}=BH_{IN}\sin\omega t+(\tfrac{1}{2})CH_{IN}^2\sin(2\omega t-\pi/2) \qquad (7)$$

wherein constants A, B and C are, respectively, such that $A=\cos^2\theta_F/2$, $B=(\cos\theta_F\sin\theta_F)/H_s$, and $C=\sin^2\theta_F/2H_s^2$. The modulation factor, $m_o$, is defined as $V_{OAC}/V_{ODC}$ and can thus be obtained from the equations (6) and (7). The modulation factor, $m_o$, relative to an output fundamental wave, $\omega$, is expressed according to the following equation (8) as a function of the temperature, T, $$m_o(T)=B(T)H_{IN}/(A(T)+C(T)H_{IN}^2/2) \qquad (8)$$

On the other hand, the optical magnetic field sensor having an optical system capable of detecting all the order beams of the light diffracted from a magneto-optical element has an output given by the afore-indicated equation (2). The DC component, $V_{allDC}$, of the output and the AC component, $V_{allAC}$, can be, respectively, given by the following equations (9) and (10)

$$V_{allDC}=\tfrac{1}{2} \qquad (9)$$

$$V_{allAC}=DH_{IN} \text{ wherein } D=\sin2\theta_F/H_s \qquad (10)$$

Thus, the modulation factor, $m_{all}$, is expressed, as a function of the temperature, T, by the following equation (11)

$$m_{all}(T)=2D(T)H_{IN} \qquad (11)$$

From the equations (8) and (11), the temperature characteristic of sensitivity of the optical magnetic field sensor depends greatly on the detecting conditions of the diffracted beams of the magneto-optical element. More particularly, a magneto-optical element is improved in composition so that the temperature variation of the modulation factor represented by the equation (8) is made small on application to known sensor optical systems where a zeroth-order beam alone is detected. If this magneto-optical element is applied to a sensor optical system capable of detecting all the order beam,% the modulation factor is accorded to the equation (11). Thus, the temperature characteristic of sensitivity greatly varies.

However, if the composition of the magneto-optical element is properly controlled, as in Table 1, for application to a sensor optical system capable of detecting all the order beams, the modulation factor accorded to the equation (11) does not vary depending on the temperature even if the magnitude of the applied magnetic field $H_{IN}$ is changed. In other words, it is possible to create an optical magnetic field sensor of high accuracy whose linearity error does not change depending on the temperature. On the other hand, with an optical magnetic sensor which detects only the zeroth order beam, the modulation factor accorded to the equation (8) contains the member of the square of the magnetic field. Thus, if the magnitude of the applied magnetic field, $H_{IN}$, is varied, the temperature characteristic varies.

Where a sensor optical system capable of detecting beams of zeroth to higher orders of diffracted light is adopted in order to increase the measuring accuracy of an optical magnetic field sensor which utilizes a magneto-optical element made of rare earth iron garnet crystals, it is necessary to appropriately change the composition of rare earth iron garnet crystals in a manner as in the present invention.

In Table 1, the combinations of Bi+Gd+La+Y are used as Bi-substituted site. Rare earth iron garnet crystals having other combinations of rare earth element or elements along with other additive elements and at least one element selected from Ga, Al, Sc, In and Pt for substitution with part of Fe may also be used to constitute an optical magnetic field sensor as having a reduced temperature characteristic of sensitivity and a good linearity error. Examples of such combinations may include those of Bi+Gd+Y, Bi+Gd, Bi+Tb, Bi+Yb+Tb, Bi+Eu+Ho, Bi+Nd+Tb, Bi+Ho+Tb and Bi+Er+Pb.

EXAMPLE 2

Among the above combinations, rare earth iron garnets comprising a combination of Bi+Gd+Y or Bi+Gd and Fe which was not partially substituted with any non-magnetic element were found to be suitable for this purpose as having a great saturation magnetic, $H_s$.

Like Example 1, rare earth iron garnet crystals of the afore-indicated general formula (4) were each epitaxially grown on a Ca-Mg-Zr-substituted $Gd_3Ga_5O_{12}$ substrate using a $Bi_2O_3$-PbO-$B_2O_3$ flux according to a liquid phase epitaxial method.

In order to evaluate the temperature characteristic of the resultant magneto-optical element, an optical magnetic field sensor as show in FIG. 3 was assembled as in Example 1. Each sensor was subjected to measurement of a temperature variation of sensitivity within a range of a magnetic field not higher than the saturation magnetic filed of the magneto-optical element. In this case, the frequency of an AC magnetic field was 60 Hz. The samples marked with "#" at the column of "Variation Rate of Sensor Sensitivity" were outside the scope of the invention. The results are shown in Table 2.

TABLE 2

| Sample No. | Composition of rare Earth Iron Garnet Crystals | | | | Variation Rate of Sensor Sensitivity % (−20 to 80° C.) |
|---|---|---|---|---|---|
| | Bi x' | Gd y' | La z' | Y 3-x'-y'-z' | |
| 12 | 1.24 | 0.80 | 0.03 | 0.93 | #3.5% |
| 13 | 1.22 | 1.00 | 0.02 | 0.76 | 3.0% |
| 14 | 1.20 | 1.26 | 0.02 | 0.52 | 2.5% |
| 15 | 1.30 | 1.42 | 0.02 | 0.26 | 2.1% |
| 16 | 1.30 | 1.50 | 0.00 | 0.80 | 1.0% |
| 17 | 1.10 | 1.62 | 0.04 | 0.24 | 1.9% |
| 18 | 1.24 | 1.70 | 0.05 | 0.01 | 2.6% |
| 19 | 1.12 | 1.80 | 0.06 | 0.02 | 3.0% |
| 20 | 0.90 | 2.00 | 0.10 | 0.00 | #3.4% |

As will be apparent from the above results, the garnet crystals of the afore-indicated formula (4) wherein $1.10 \leq x' \leq 1.30$, $1.00 \leq y' \leq 1.80$, $0 \leq z' \leq 0.06$, have a temperature variation of sensitivity of not greater than 3% (i.e. not greater than ±1.5%) within a temperature range of from −20° C. to +80° C. The comparison with FIG. 5 reveals that the temperature characteristic is significantly improved.

Since the magneto-optical elements of this example were applied to the optical magnetic field sensor using a converged beam optical system as shown in FIG. 3, the linearity of the output was evaluated, revealing that the linearity is as good as not higher than 2.0% within a magnetic field ranging up to about 1500 Oe at which the rare earth iron garnet crystals are magnetically saturated.

In Examples 1 and 2, La was used as a substitution element for lattice matching. Other rare earth elements may be used singly or in combination as R in the general formulas (3) and (4). To this end, non-magnetic elements such as Yb, Lu, and the like, which do not adversely influence the saturation magnetization of the rare earth iron garnet crystals are preferred to obtain good results.

As a matter of course, where a garnet crystal substrate having a lattice constant different from that of the Ca-Mg-Zr-substituted $Gd_3Ga_5O_{12}$ substrate is used, proper selection of at least one rare earth element as R permits lattice matching with the garnet crystal substrate, thereby forming rare earth iron garnet crystals which have good linearity error and temperature characteristics.

It should be noted that the linearity error and temperature characteristic were determined using a light source capable of emitting light with a wavelength of 0.8 µm. The improvements in the linearity error and temperature characteristic were also found for light beams with other wavelengths of 1.3 µm and 1.5 µm which were able to transmit the garnet crystals.

Moreover, the frequency used was 60 Hz, and a magnetic field ranging from a DC magnetic field to several hundreds kHz could be measured in high accuracy using the sensors of the examples.

Similar results were also used when the magneto-optical elements of the examples were grown on a $Nd_3Ga_5O_{12}$ substrate in place of the Ca-Mg-Zr-substituted $Gd_3Ga_5O_{12}$ substrate but using different growth conditions.

It will be noted that although the liquid phase epitaxy was used in Examples 1 and 2, a vapor phase growth may also be used with similar results. In this connection, depending on the growth conditions of either the liquid phase or vapor phase epitaxy, the rare earth iron garnet crystals defined by the formulas (3) and (4) may not be epitaxially grown on a substrate, but is deposited as a polycrystal. Such a polycrystal is sufficient for use as a magneto-optical element although the light absorption loss may increase to a slight degree.

EXAMPLE 3

In the same manner as in Example 1, $Bi_{1.14}Gd_{0.57}La_{0.02}Y_{1.27}Fe_{4.53}Ga_{0.47}$ (No. 8 of Table 1) was formed on a Ca-Mg-Zr-substituted $Gd_3Ga_5O_{12}$ substrate according to the liquid phase epitaxial method in different thicknesses ranging from 40 to 75 µm.

Figure 9:
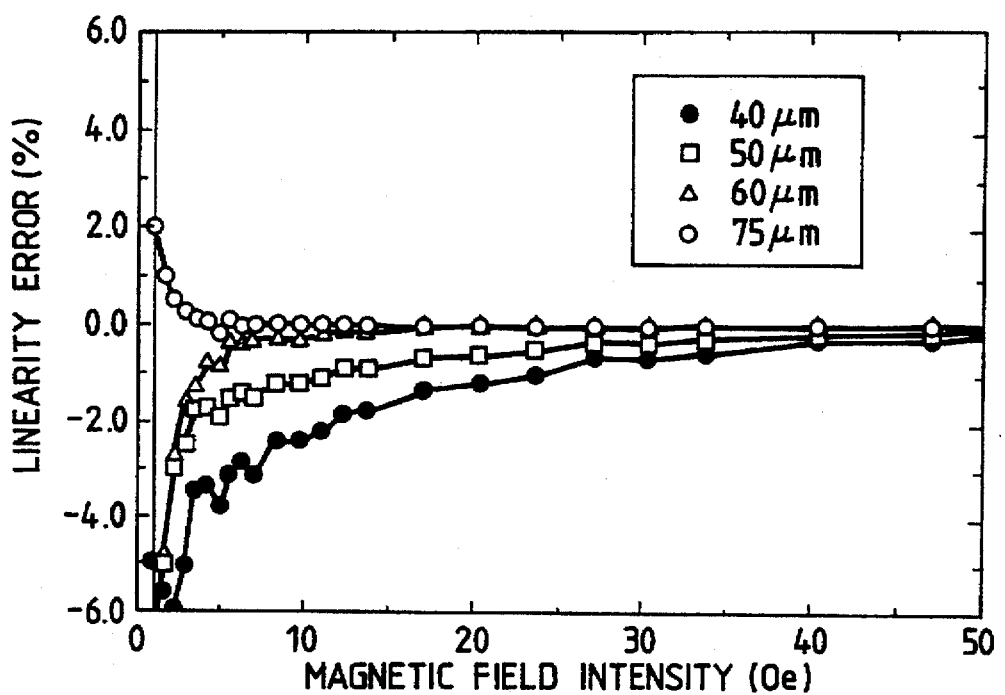
FIG. 9 is a graph showing the relation between the linearity error and the magnetic field intensity for different thicknesses of a magneto-optical element.

The resultant magneto-optical elements were each set in an optical magnetic field sensor of the type shown in FIG. 3. These sensors were subjected to measurement of linearity error in a weak magnetic field intensity ranging from about 5 to 50 Oe. The dependence of the linearity on the film thickness is shown in FIG. 9. From the figure, it will be seen that the linearity error depends greatly on the film thickness in the element. More particularly, as the thickness increases, the linearity error in the weak magnetic field is significantly improved. As stated hereinbefore, this is because the polarization angle of light diffracted in the element can be changed by changing the thickness of the magneto-optical element, so that the diffracted light including higher order beams can be detected at the end of the output optical fiber in the optical system of the optical magnetic field sensor. The reason why the linearity error increases to positive infinity at a very small magnetic field in FIG. 9 is that the output from a signal processing circuit of the optical magnetic field sensor contains a noise component of the circuit at a magnetic field of zero. FIG. 9 reveals that in order to measure the linearity error within an accuracy of not higher than ±2% at a magnetic field intensity of from about 5 to 50 Oe, it is preferred to use a magneto-optical element having a thickness of 50 µm or over.

Especially, when a magneto-optical element whose film thickness is 75 µm is used, the linearity is very good, with a linearity error being not greater than 2%. This thickness dependency of the linearity was recognized at a greater thickness. This thickness dependency was also confirmed using other types of rare earth iron garnet materials of the formulas (3) and (4). It is considered that the thickness dependency will develop when using those materials other than the materials of the formulas (3) and (4) provided that they are of the type having magnetic domains therein.

EXAMPLE 4

An optical magnetic field sensor of the type shown in FIG. 6 was fabricated using a transducer unit T which includes a glass polarizer 12, a magneto-optical element made of a garnet of the invention, a glass polarizing plate as an analyzer 13, and a total reflection mirror 14, and a pair of optical units each consisting of a spherical lens and an optical fiber and arranged in parallel to each other as extending from the analyzer 12 and the total reflection mirror 14, respectively. The polarizer, element, analyzer and mirror were bonded together with an optically transparent resin adhesive.

By this, the input optical fiber 16a/the magneto-optical element 10 and the magneto-optical element 10/the output optical fiber 16b were arranged to constitute a confocal optical system through the respective lenses 15a, 15b, and the confocal optical system is substantially axially symmetric with respect to the magneto-optical element 10. The axially symmetric, confocal arrangement is able to detect from zeroth to higher-order beams of light diffracted with the magneto-optical element having magnetic domains.

From the results of the ray tracings, it was found that the conditions of minimizing an optical insertion loss in the sensor optical system wherein when the polarizer 12 and the total reflection mirror 14 were each set at 5 mm square, spherical lenses 15a, 15b, each made of glass BK 7, had, respectively, a diameter of 3 mm, and a distance, y, was 1.0 mm, a distance, x, was in the range of 1.0 to 1.4 turn. In this condition, the optical insertion loss was found to be −13 dB.

Figure 4:
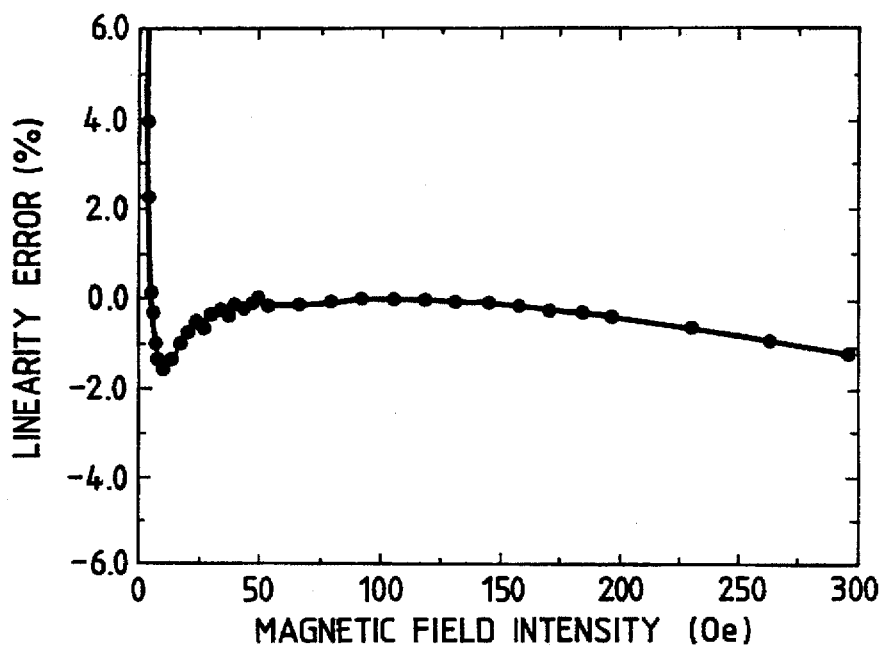
FIG. 4 is a graph showing the relation between the linearity error and the magnetic field intensity of a known optical magnetic field sensor.
Figure 10:
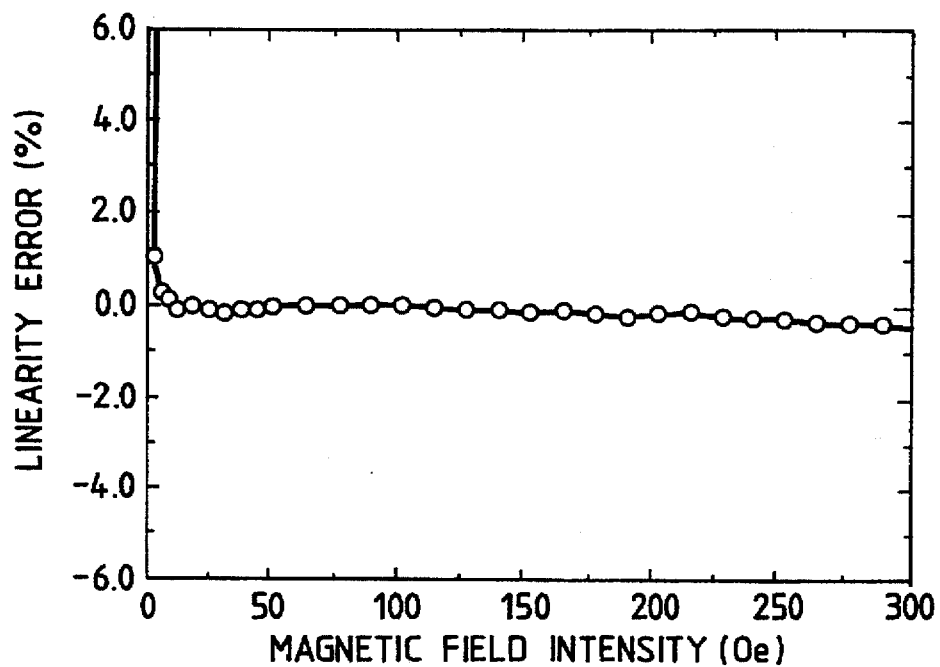
FIG. 10 is a graph showing the relation between the linearity error and the magnetic field intensity of an optical magnetic field sensor using a magneto-optical element made of a garnet film according to the invention.

The linearity error of the thus fabricated optical magnetic field sensor are shown in FIG. 10. As will be apparent from FIG. 10, the linearity error of the sensor is better than that shown in FIG. 4 using the known sensor structure over a wider range of magnetic field. The linearity error in the range up to 300 Oe is as small as not greater than 1%.

So far as the confocal optical system is established, the respective components may be small in size so as to make a small-size optical magnetic field sensor. Such a small-size sensor ensures the measurement of a magnetic field intensity in high accuracy.

EXAMPLE 5

This example illustrates an optical magnetic field sensor shown in FIG. 7. In the figure, the optical axes of the transducer T and a pair of optical units each consisting of an optical fiber and a spherical lens are arranged in line so that the input optical fiber 16a/the magneto-optical element 10 and the magneto-optical element 10/the output optical fiber 16b were arranged to constitute a confocal optical system through the respective lenses 15a, 15b, and the confocal optical system is relatively exactly axially symmetric with respect to the magneto-optical element 10 as in Example 4.

In this example, in order to make a linear sensor, the polarizer 12 and the analyzer 13 were, respectively, made of a glass polarizing plate. In this example, the respective parts or elements used were smaller in size than those of Example 4. More particularly, the magneto-optical element 10, polarizer 12 and analyzers 13 were, respectively, in the form of a disk having a diameter of 2 mm and bonded together with an optically transparent resin adhesive. The spherical lenses 15a, 15b were, respectively, made of BK7 and were in the form of a disk having a diameter of 2 mm.

The conditions of minimizing the optical insertion loss of the sensor in case where both distances between the spherical lens 15a and the polarizer 12 and between the analyzer 13 and the spherical lens 15b were 1.5 mm, the distances between the input optical fiber 16a and the spherical lens 15a and between the spherical lens 15b and the spherical lens 16b were found to be 1.4 to 1.8 mm. Under the conditions, the optical insertion loss was found to be −13 dB.

What is claimed is:

1. A magneto-optical element comprising a film of a Bi-substituted rare earth iron garnet selected from the group consisting of garnets of the following chemical formulas (3) and (4)

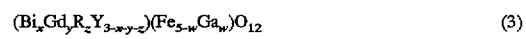  (3)

wherein R represents at least one element selected from the group consisting of rare earth elements other than Gd, and x, y, z and w are such that $1.00 \leq x \leq 1.30$, $0.42 \leq y \leq 0.60$, $0.01 \leq z \leq 0.05$ and $0.40 \leq w \leq 0.62$, and

  (4)

wherein R is as defined above, and x', y' and z' are such that $1.10 \leq x' \leq 1.30$, $1.00 \leq y' \leq 1.80$, $0 \leq z' \leq 0.06$ provided that $x'+y' \leq 3.0$.

2. A magneto-optical element according to claim 1, wherein said element consists of said film.

3. A magneto-optical element according to claim 1, wherein said rare earth iron garnet is of the formula (3).

4. A magneto-optical element according to claim 3, wherein R is La.

5. A magneto-optical element according to claim 3, wherein R is a mixture of La and Y.

6. A magneto-optical element according to claim 3, wherein R is a mixture of La and Lu.

7. A magneto-optical element according to claim 1, wherein said rare earth iron garnet is of the formula (4).

8. A magneto-optical element according to claim 7, wherein R is La.

9. A magneto-optical element according to claim 7, wherein R is a mixture of La and Y.

10. A magneto-optical element according to claim 7, wherein R is a mixture of La and Lu.

11. A magneto-optical element according to claim 1, further comprising a garnet crystal substrate having thereon said rare earth iron garnet in the form of a film.

12. A magneto-optical element according to claim 11, wherein said garnet crystal substrate consists of Ca-Mg-Zr-substituted $Gd_3Ga_5O_{12}$.

13. A magneto-optical element according to claim 1, wherein said film has a thickness of not smaller than 50 µm.

* * * * *